(12) United States Patent
Bhatti et al.

(10) Patent No.: US 10,332,742 B2
(45) Date of Patent: *Jun. 25, 2019

(54) METHOD FOR THE SYNTHESIS OF CATALYST DOPED ZNS NANOSTRUCTURES

(71) Applicant: COMSATS Institute of Information Technology, Islamabad (PK)

(72) Inventors: Arshad Saleem Bhatti, Islamabad (PK); Muhammad Hafeez, Islamabad (PK); Shania Rehman, Islamabad (PK)

(73) Assignee: COMSATS Institute of Information Technology, Islamabad (PK)

( * ) Notice: Subject to any disclaimer, the term of this patent is extended or adjusted under 35 U.S.C. 154(b) by 283 days.

This patent is subject to a terminal disclaimer.

(21) Appl. No.: 15/401,803

(22) Filed: Jan. 9, 2017

(65) Prior Publication Data
US 2017/0200607 A1  Jul. 13, 2017

(30) Foreign Application Priority Data

Jan. 11, 2016  (PK) ......................... 22/2016

(51) Int. Cl.
*H01L 21/02* (2006.01)
*C09K 11/56* (2006.01)

(52) U.S. Cl.
CPC ...... *H01L 21/02653* (2013.01); *C09K 11/565* (2013.01); *H01L 21/02381* (2013.01); *H01L 21/02488* (2013.01); *H01L 21/02557* (2013.01); *H01L 21/02581* (2013.01); *H01L 21/02603* (2013.01); *H01L 21/02645* (2013.01)

(58) Field of Classification Search
CPC ... C09K 11/565; C09K 11/584; C09K 11/574; C09K 11/662; H01L 21/02653
See application file for complete search history.

(56) References Cited

U.S. PATENT DOCUMENTS 10,096,469 B2\*  10/2018  Bhatti ............... H01L 21/02381
2011/0076841 A1\*  3/2011  Kahen ................. H01L 21/0237
                                                                           438/501

\* cited by examiner

*Primary Examiner* — C Melissa Koslow
(74) *Attorney, Agent, or Firm* — H.C. Park & Associates, PLC

(57) ABSTRACT

A method of synthesizing catalyst doped ZnS nanostructures including preparing a silicon substrate by vacuum depositing a metal catalyst nanostructure on an ultrathin silicon oxide layer, doping a zinc sulfide (ZnS) nanostructure with a catalyst of the metal catalyst nanostructure including at least one of gold (Au), manganese (Mn), and tin (Sn), and modulating ZnS intrinsic defects by the concentration of the catalyst and the size of the ZnS and metal catalyst nanostructures, in which the catalyst is dissolved in a nanowire of the ZnS nanostructure during growth, the concentration of the catalyst in the nanowire is dependent on the size of the catalyst, and the doping is tuned by growth conditions.

14 Claims, 9 Drawing Sheets

FIG. 7A
FIG. 7B
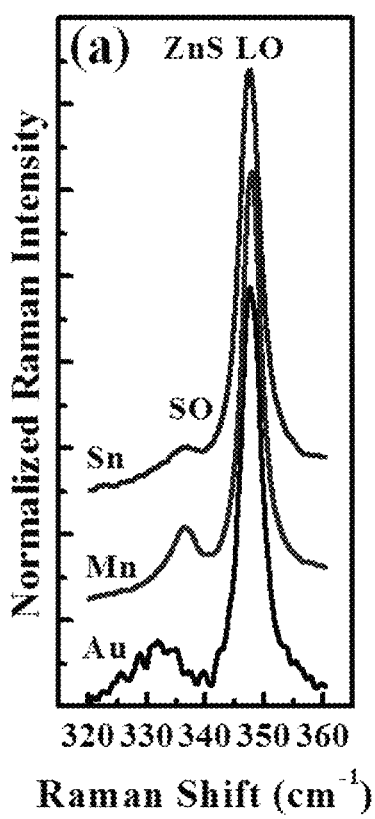
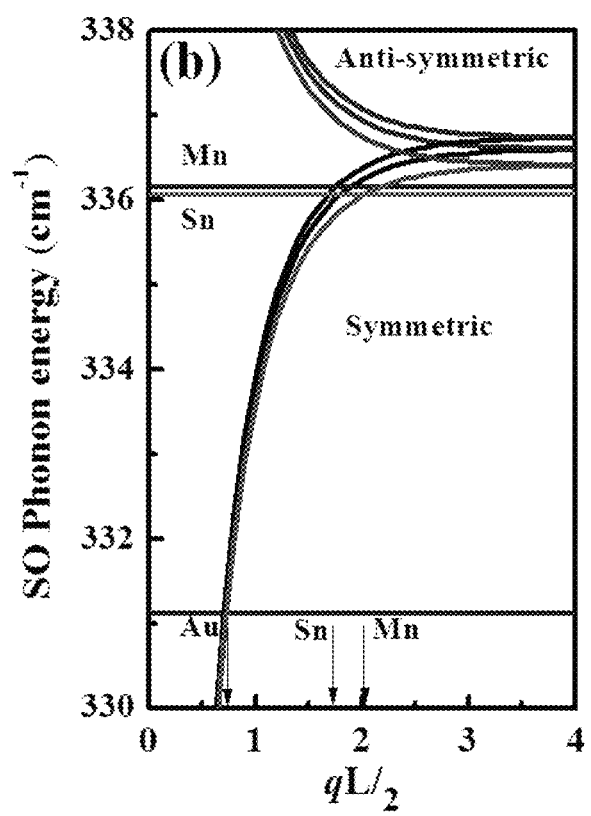

METHOD FOR THE SYNTHESIS OF CATALYST DOPED ZNS NANOSTRUCTURES

CROSS-REFERENCE TO RELATED APPLICATION

This application claims priority from and the benefit of Pakistan Provisional Application No. 22/2016, filed on Jan. 11, 2016, which is hereby incorporated by reference for all purposes as if fully set forth herein.

BACKGROUND

In recent past, nanoparticles or quantum dots, nanowires, nanorods have become attractive because of the properties that are different from their bulk counterparts. Their unique characteristics may be attributed to quantum confinement effects, which may have led to band gap engineering. Zinc Sulfide (ZnS), a wide band gap semiconductor, has found various applications as optical phosphors, photonic crystals, UV sensors, photo-conducting switch, solar cells, field emitters, and light emitting materials. ZnS absorbs only UV radiation because of its large band gap, but its absorption and emission band may be altered by doping it with metal ions, such as manganese (Mn), nickel (Ni), copper (Cu), and lead (Pb). Furthermore, intrinsic defects, such as Zn and S electronic vacancies in ZnS nanostructures, may play a role in the visible emission. The amount of Zn and S vacancies has been reported to depend strongly on the growth and post growth processing conditions.

In general, ZnS in its Wurtzite phase may be more desirable than in its Sphalerite phase because of superior optical properties in its Wurtzite phase. ZnS nanowires and nanobelts have been demonstrated to have similar photoluminescence (PL) emission bands. Incorporation of metal ions actually offers an efficient radiative channel by introducing a band gap state, which may alter the optical properties of the host material. Thus, the choice and location of the metal ion in the host lattice is very important in defining the radiative recombination pathway.

Photoluminescence and electroluminescence properties of Mn doped ZnS have been extensively studied. ZnS has attained unusual attention in electroluminescent devices, lasers, and flat panel displays when doped with Mn. Doping of Mn in ZnS crystal has been reported to reduce the probability of nonradiative recombinations, and to make the Mn doped ZnS to phosphor in the range 590 nm to 620 nm due to radiative recombinations between the Mn d-states. Coupling of sp states of nanocrystalline ZnS and 3d states of Mn may result in faster transfer of electron from ZnS band to Mn 3d states in 5 orders of magnitude. The PL spectrums of undoped ZnS nanobelts and Mn doped ZnS nanobelts have shown some emission bands at 440 nm and 540 nm, bands of which may be assigned to defects produced by Sulfur (S) and Zn electron vacancies, respectively, while the emission band observed at 590 nm Mn doped ZnS may be attributed to Mn d-d state transition. In the case of Cu-doped ZnS nanorods, green emission may be attributed to elemental S species present on a nanorod surface, and orange emission may be associated with recombination of electron at deep defect levels of Cu introduced states. Surface defect states are well known to be responsible for the blue emission at 410 nm, green emission at 540 nm originated from Zn vacancy states, or interstitial states.

Recently, the role of the intrinsic defects like Zn and S interstitials and vacancies on the visible luminescence from the ZnS nanostructure has been studied. The interstitials and vacancies created by both Zn and S may lead to strong luminescence in the band gap with varying decay times. The magnitude of defects may be controlled by annealing the nanostructures in an inert atmosphere, in which the annealing may affect the optical properties.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide the optical properties of Mn, Sn, and Au catalyzed and doped ZnS nanowires grown by vapor liquid solid (VLS) technique under identical conditions. Room temperature photoluminescence and Raman spectroscopies have been used to determine the variations in the visible emission bands as a consequence of doping of different catalysts. The magnitude of emission intensities may be compared to determine the role of each catalyst in the defect luminescence or vacancy creation. Additionally, the effect of physical size of the catalyst on the optical properties was also determined and estimated. Finally, LO and SO phonon modes were studied to determine the variation in the surface potential modulation created as a result of doping of catalysts on the surface by using the dielectric continuum model.

According to an exemplary embodiment, a method of synthesizing catalyst doped ZnS nanostructures includes preparing a silicon substrate by vacuum depositing a metal catalyst nanostructure on an ultrathin silicon oxide layer, doping a zinc sulfide (ZnS) nanostructure with a catalyst of the metal catalyst nanostructure including at least one of gold (Au), manganese (Mn), and tin (Sn), and modulating ZnS intrinsic defects by the concentration of the catalyst and the size of the ZnS and metal catalyst nanostructures. The catalyst is dissolved in a nanowire of the ZnS nanostructure during growth, the concentration of the catalyst in the nanowire is dependent on the size of the catalyst, and the doping is tuned by growth conditions.

The optical properties of the ZnS nanostructure may be tuned by complementing concentration and size of the catalyst.

The catalyst may include at least one of gold, manganese, and tin.

Band gap emission of the ZnS nanostructure in a red region may be caused by a creation of deep defects caused by dopant atoms in the ZnS nanostructure.

Variations in blue and green emissions due to S vacancies and Zn vacancies are modulated by the type of the catalyst and the concentration.

The growth conditions of the ZnS may include varying at least one of temperature, carrier gas, the size of the catalyst, and concentration of the catalysts.

The catalyst may be provided as a droplet including Mn having a radius of about 25 nm.

A thickness of the metal catalyst nanostructure including Mn may be in a range of 0.2 to 1.0 nm.

The catalyst may be provided as a droplet including Au having a radius of about 31 nm.

A thickness of the metal catalyst nanostructure including Au may be about 0.5 to 30 nm.

The catalyst may be provided as a droplet including Sn having a radius of about 50 nm.

A thickness of the metal catalyst nanostructure including Sn may be 1.0 nm.

According to an exemplary embodiment, a zinc sulfide (ZnS) nanostructure is formed on a silicon substrate including an ultrathin silicon oxide layer, and included ZnS intrinsic defects and a catalytic amount of at least one of gold (Au), manganese (Mn), zinc (Zn), and tin (Sn) therein. The blue and green emissions from the ZnS nanostructure are due to the amount of sulfur (S) vacancies on the surface thereof, and Zn vacancies may be modulated during the formation of the ZnS nanostructure.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 7A illustrates Raman Spectra displaying LO and SO modes of ZnS nanostructures catalyzed with (top) Sn, (middle) Mn, and (bottom) Au. FIG. 7B illustrates symmetric and anti-symmetric SO phonon dispersion curves as a function of correlation length.

DETAILED DESCRIPTION OF ILLUSTRATED EMBODIMENTS

Figure 1:
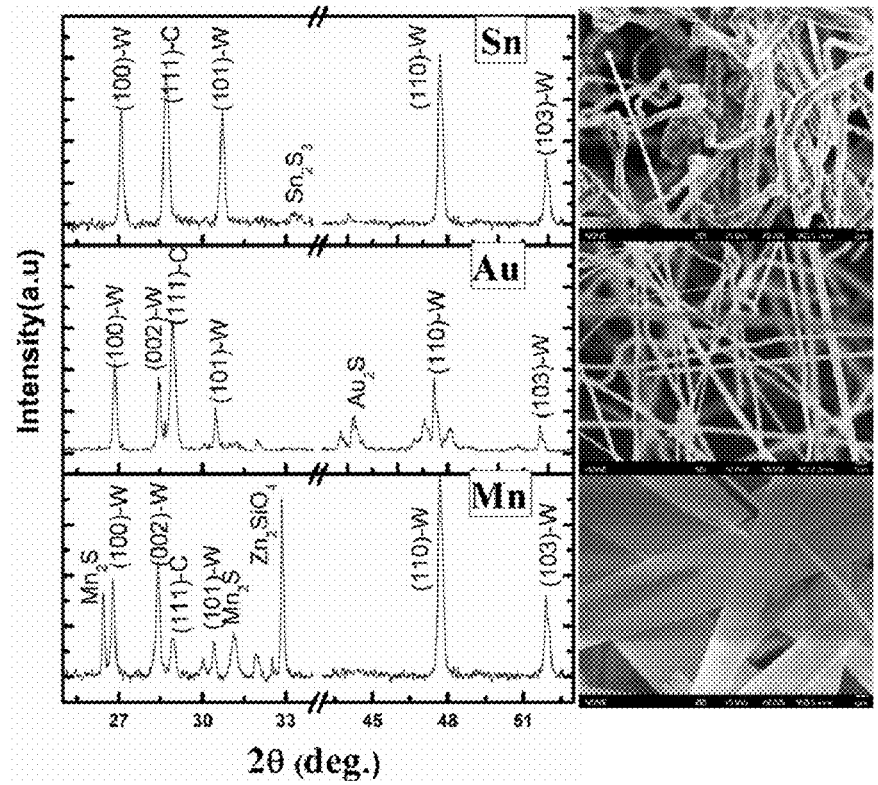
FIG. 1 illustrates XRD patterns of the ZnS nanowires catalyzed by Sn (top), Au (middle), and Mn (bottom) nanoparticles.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath." "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises." comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As used herein, according to exemplary embodiments. Si (100) substrates with a thin (2-3 nm) native oxide layer were used for the growth of nanostructures. Droplets including a catalyst, such as Au, Mn, and Sn, were thermally evaporated and deposited on the substrate as Au (0.5 nm, 1.0 nm, and 30 nm), Mn (0.2 nm, 0.5 nm, and 1.0 nm), and Sn (1.0 nm) thin films at room temperature at a base pressure of 3×10−6 Torr. The catalyst coated substrates were then placed in a horizontal tube furnace along with 99.99% pure ZnS powder (e.g., 1 g) in an alumina boat placed at the center of the tube for each growth. ZnS powder was heated to 1120° C. in a flowing carrier N2 gas mixed with 5% hydrogen at a flow rate of 20 Sccm. Catalyst coated substrates were placed in the downstream and kept at 850° C. The growth was performed for 2 hours and then samples were furnace cooled. The synthesized catalyst films and ZnS nanostructures were characterized using AFM (Agilent's PicoPlus), field emission SEM (JEOL 6700F), and XRD (PANALYTICAL Xpert Pro) for surface topography of catalysts, morphology of grown nanostructures and phase identification, respectively. Optical properties were measured at room temperature using Raman spectrometer (Hioriba Jobin-Yvon T6400 and LabRam III by DongWoo excited with 514 nm Ar laser) and a micro photoluminescence (PL) spectrometer (Horiba Jobin-Yvon S.A.S using He—Cd laser emitting at 325 nm) were used. All optical spectra were corrected for detector response.

According to an exemplary embodiment, FIG. 1 shows the XRD patterns (left column) and SEM images (right column) of the Tin (Sn) (top), Gold (Au) (middle), and Mn (bottom) catalyzed ZnS nanowires. Gold (Au) and Tin (Sn) may be employed as catalysts that may have led to the growth of nanowires while the use of Mn may have resulted in nanobelts. In FIG. 1, W and C represents Wurtzite and Cubic phases, respectively. All structures were grown at 850° C. The right side shows the SEM images of the ZnS nanostructures for reference. The variation in the final morphology of ZnS nanostructures may be due to a number of factors, for example, different surface coverages of the catalysts, surface tensions of liquid droplets, and differences in the catalysts used. Although the synthesis of morphologically different ZnS nanostructures obtained by varying the growth temperature is generally well-known in the art, according to exemplary embodiments, different surface coverages by the catalyst droplets and the surface tensions of catalyst droplets has led to the variation in morphology.

From the XRRD spectra according to FIG. 1, the major phase of the grown ZnS nanostructures was Wurtzite, and cubic ZnS was the minor phase. Major diffraction peaks observed were (100), (101), (110), and (103) for Wurtzite and (111) peak for the cubic phase. The 1D nanostructures, which are synthesized by diffusion of the growth species through the catalyst droplet (as in VLS mechanism), may have formed the Wurtzite phase. The presence of both phases may be due to incorporation of stacking faults in the growing nanostructures. The dissolution of catalysts in the host lattice was observed as weak diffraction peaks due to $Sn_2S_3$, $Au_2S$, and $MnS_2$. The XRD quantitative analysis shows that the mixing of Sn was the least, and the most for Mn. The formation of impurity phases in ZnS may depend on two factors; size of the catalyst droplet, and the difference of surface energies of the catalyst with the host lattice. The measured radii of droplets, as from the AFM images (not shown), for Mn, Au, and Sn were 25±2 nm, 31±2 nm, and 50±3 nm, respectively, and were in accordance with the surface energy of Mn (1.17 J/m$^2$), Au (0.96 J/m$^2$), and Sn (0.45 J/m$^2$) droplet.

Surface coverage also depended on surface energies, and was different for the three catalyst droplets, namely, 21%, 51%, and 66% for Mn, Au, and Sn, respectively. Solubility of the catalyst may be one of the key issues in the growing nanowires, as doping may be induced in the nanostructures, which may affect the optical properties of nanostructures either by varying the magnitude of the mixed crystalline phases of the grown ZnS or by modifying the intrinsic Zn and S vacancies depending strongly on the type of the catalyst Additionally, doping may also lead to variation in the formation of catalyst related defects. The existence of Zn and S vacancies and formation of catalyst mixed phases may be determined using X-ray photoelectron emission spectroscopy (XPS).

Figure 2A:
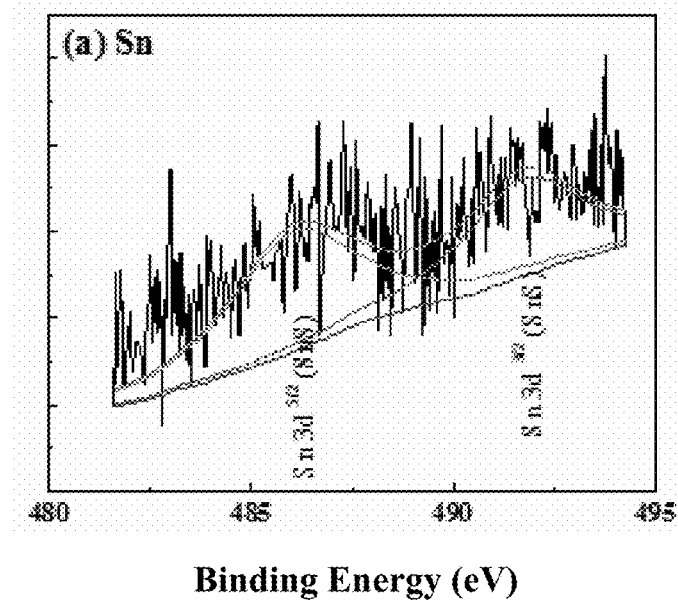
FIG. 2A, FIG. 2B, and FIG. 2C illustrate XPS spectra from ZnS nanowires catalyzed by Sn (top), Au (middle), and Mn (bottom) nanoparticles, respectively.
Figure 2B:
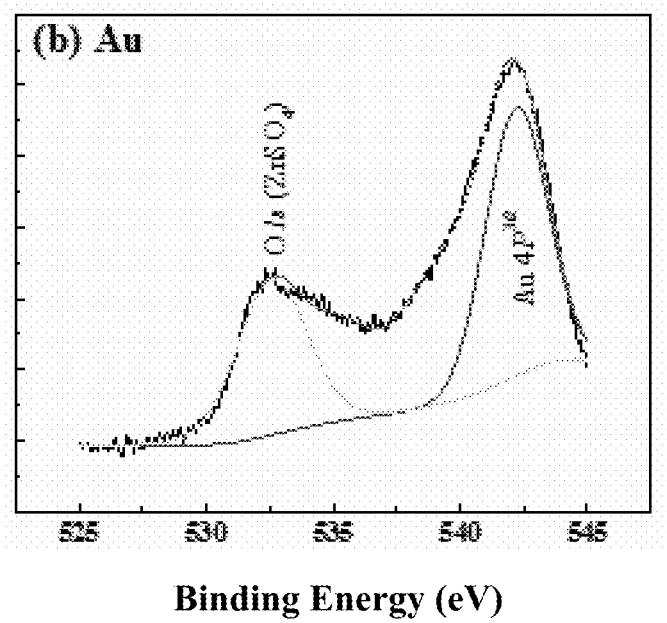
Figure 2C:
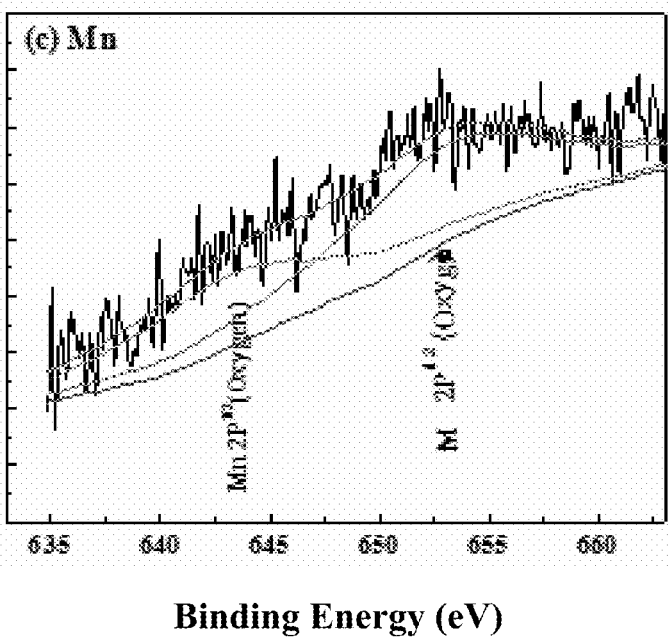

FIGS. 2A, 2B, and 2C show high resolution XPS spectra as obtained from Sn, Au, and Mn catalyzed ZnS nanostructures in respective catalyst's binding energies according to exemplary embodiments. The smooth curves are the fits to determine the exact energy position and contribution. Also marked in the FIGS. 2A to 2C are the origins of XPS peaks. Peaks were labeled with the origin of the transition for each element, and the state of each catalyst as determined from the XPS analyses is summarized in Table 1, which shows the contribution of catalyst (Mn, Au, or Sn), Zn, S, O, and N at the surface of ZnS nanostructures.

TABLE I

Percentage compositions of various elements as obtained from the XPS spectra.

| Catalyst | Carbon | Catalyst | Zinc | Sulphur | Oxygen | Nitrogen |
|---|---|---|---|---|---|---|
| Mn | 50.27% | Mn (4.7%) | 6.88% | 1.37% | 32.33% | 5.03% |
| Au | 54.56% | Au (4.63%) | 5.27% | 1.70% | 32.96% | 0.31% |
| Sn | 50.33% | Sn (3.03%) | 4.22% | 3.93% | 30.44% | 6.05% |

The content of oxygen may be similar in all of ZnS nanostructures. This may be due to adsorption of oxygen on the surface and formation of oxide with the host lattice. XPS spectra shows the solubility of the catalyst into the ZnS nanostructures during growth phase of the nanostructures, as can be seen in the Table 1. The S content may be small on the surface of Mn and Au catalyzed ZnS nanowires, while Zn content may be equal for Au and Mn catalyzed nanostructures and was the lowest in Sn catalyzed nanostructures. The quantitative analyses of XPS shows that the number of S vacancies may be large in Mn and Au catalyzed ZnS nanostructures as compared to the number of Zn vacancies, while the number of S vacancies were small in Sn catalyzed ZnS nanostructures. Similarly, the number of Zn vacancies may be the highest in Sn catalyzed ZnS nanostructures and may be small and comparable in Au and Mn catalyzed ZnS nanostructures. Thus the XPS analysis may confirm that the numbers of Zn and S vacancies are strongly related to the type of the catalyst. Additionally, small amounts of nitrogen were also observed in the nanostructures.

Figure 3A:
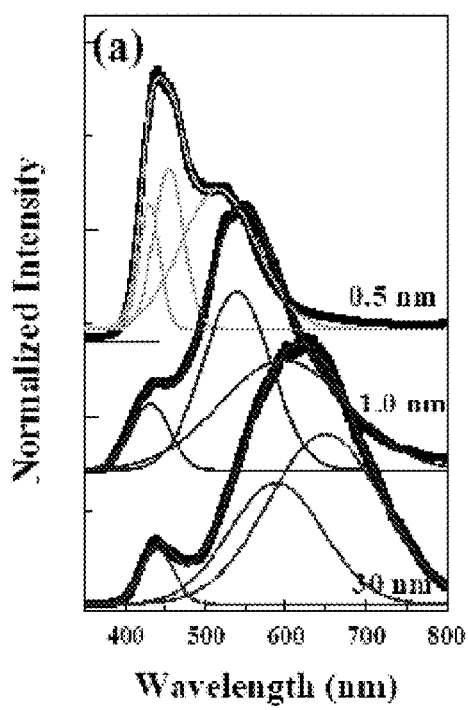
FIG. 3A illustrates room temperature PL, spectra of ZnS nanostructures catalyzed by Au with different Au thicknesses.

Room temperature photoluminescence (PL) spectroscopy in the visible range was performed to determine the role of thickness of catalysts as well as the type of catalysts. It is generally well-known in the art that ZnS may have a band gap at UV (3.7 eV). However, the PL spectroscopy shows strong emission bands in the visible range. The PL bands in the visible range may be attributed to Zn vacancies, S vacancies, and the catalyst induced defects. FIG. 3A shows the room temperature PL spectra obtained from ZnS nanostructures catalyzed by three different thicknesses of Au catalyst, namely, 0.5 nm (top), 1.0 nm (middle), and 30 nm (bottom). The PL spectra were marked by two distinct peaks; a sharp peak at around 440 nm and a broad peak in the range 500-600 nm. Each spectrum was fitted with three Gaussian functions also shown in FIG. 3A, which assists in the determination of each contribution to the total spectra. S state defects may be responsible for emission in blue (440 nm), Zn state defects may be responsible for green emission (530-550 nm), while Au may be responsible for emission in orange-yellow (580-600 nm). S and Zn vacancies in ZnS may be responsible for blue and green emissions, respectively. The position of the sharp peak observed at 440 nm remains independent of Au thickness. However, the intensity of peak at 440 nm may point to a drastic drop with increased Au thickness. The sharp feature at 440 nm was fitted with one Gaussian function, showing contribution from one source only, i.e., luminescence emerging due to S vacancies in ZnS. If the peak intensity is related to the magnitude of the number of S vacancies, the variation of peak intensity with Au thickness may show a shift in luminescence peak to lower energy with the increase in Au thickness, that in turn may show dependence on the mechanism of luminescence. The broad feature was resolved with two Gaussian functions, one centered at 520-540 nm was due to Zn vacancies and other in the range 600-620 nm may be due to catalyst related defects created by Au. The transfer of luminescence weight may mean that with increased Au thickness, the number of Zn vacancies decreased and the number of Au defects increased.

Figure 3B:
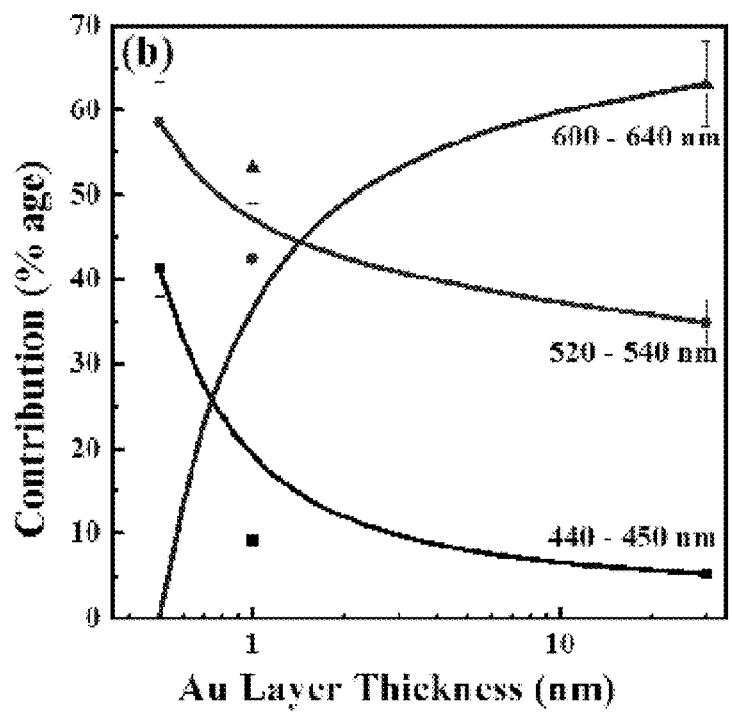
FIG. 3B illustrates the plot of the variation of contributions of three emission bands as determined from the fit of PL spectra in the total PL intensity as a function of Au thickness.

The size of Au catalyst may affect each of the components and this variation in the total integrated intensity is shown in FIG. 3B. For smaller thickness of Au, the relative number of S vacancies may be much higher than the number of Zn vacancies, and the deep traps introduced by Au itself, which were not observed in 0.5 nm Au catalyzed ZnS nanowires. However, when increasing the Au thickness, the number of Zn vacancies may increase and may overwhelm the number of S vacancies, and become the dominant luminescence mechanism. It can be seen that emission due to S vacancies was strongest (40%) in Au-0.5 nm catalyzed nanostructures and dropped to about 10% in nanostructures catalyzed with larger thickness of Au. The feature at 520 nm may also drop considerably from 60% to below 40%. Meanwhile, emission in the red band gained as the Au thickness increased from 0.5 nm to 30 nm and became a dominant catalyst. The emission in the red band may be fundamentally due to the creation of deep defects created by Au in ZnS nanostructures. The results show that the vacancies (both S and Zn) were sensitive to the thickness of the Au (catalyst) layer. For smaller catalyst thicknesses, the vacancies in the host medium were dominant, while with increased catalyst thickness, the catalyst related defects became dominant in the emission characteristics of ZnS nanostructures.

According to exemplary embodiments, dopants may be the major impurities and their effects were distinctively observed in the band gap. However, no other significant effects in the PL spectra due to minor impurities were observed. Even if present, the effects would have been masked by the dopant induced PL. The variation in Zn and S vacancy states may be attributed to the incorporation of Au into the ZnS lattice, which may be the result of the varied solubility of Au and its location due to its size as droplet. The small sized catalyst may be present on the surface in the form of $AuS_2$. However, in the case of large sizes for the droplets, for example, the 30 nm thick Au layer, it may be observed to be present in bulk in agglomerated form. For 30.0 nm Au catalyzed nanostructures, the broad peak may be due to deep defects created by Au settling in the host lattice, while in the case of smaller thicknesses, the enhanced solubility may lead to the incorporation of Au in ZnS lattice and formation Au—S bonds, thereby creating S vacancies in the Zn—S bonds.

Figure 4A:
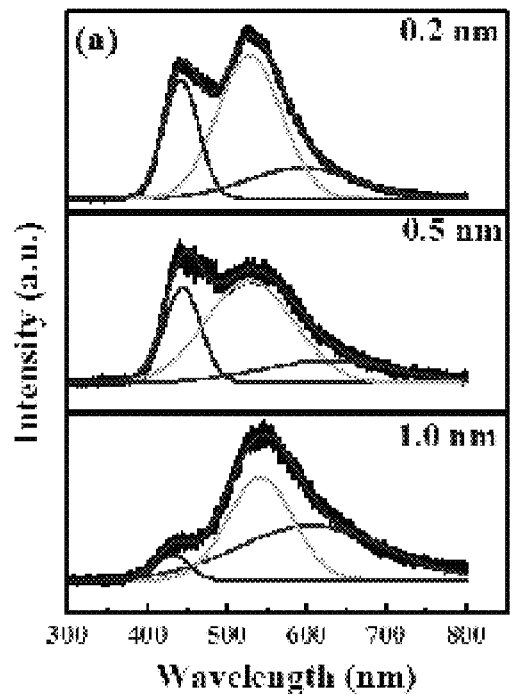
FIG. 4A illustrates PL spectra of Mn catalyzed ZnS nanowires grown with different Mn thick catalysts.
Figure 4B:
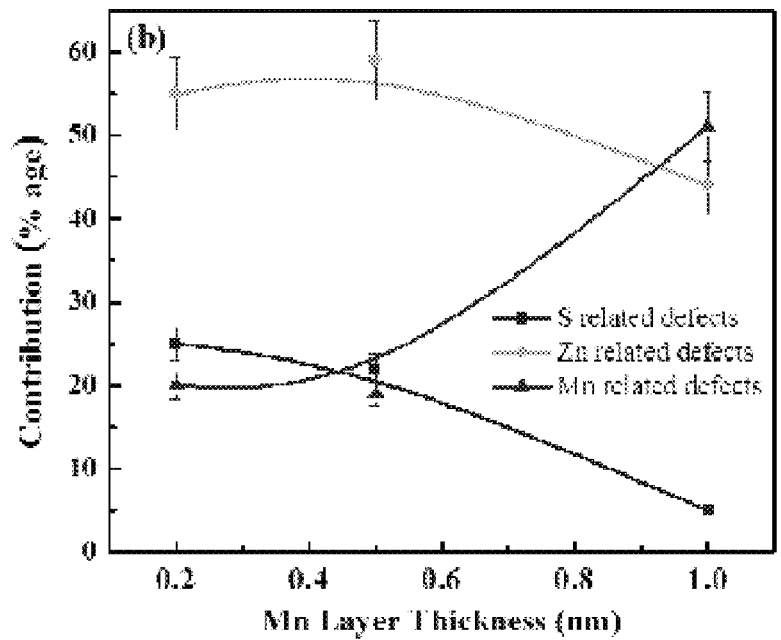
FIG. 4B illustrates the plot of the variation of contributions of three emission bands as determined from the fit of PL spectra in the total PL intensity as a function of Mn thickness.

FIG. 4A illustrates the room temperature PL spectra obtained from the 0.2 nm (top), 0.5 nm (middle), and 1.0 nm (bottom) thick Mn catalyzed ZnS nanostructures. The PL spectra again exhibits two distinct features, a small peak centered at around 440 nm and a strong broad asymmetric peak centered at 540 nm. Again, the broad peak was resolved further into two peaks at around 540 nm and 600 nm. Peak at around 600 nm may be due to Mn incorporation in the nanostructures during the growth. The contribution from each of the component is shown in FIG. 4B. The behavior was similar to the observed behavior for Au catalyzed ZnS nanostructures, except for the relative intensities of the two strong features that were comparable in Mn catalyzed ZnS nanostructures. However, in the case of Mn, Zn vacancy emission may be stronger than S vacancy emission.

The contribution of S vacancy related emissions were the highest, i.e., 25% for Mn-0.2 nm, dropped to 22% for Mn-0.5 nm and finally to 5% for Mn-1.0 nm catalyzed nanostructures. The Zn vacancy related emission may drop with increased Mn size, i.e., from 54% for Mn-02 nm to 44% for Mn-1.0 nm. The trend may be similar for both S and Zn vacancies. However, the drop in blue emission may be large compared to green emission. It is noted that number of S and Zn vacancies in 0.2 nm and 0.5 nm thick Mn catalyzed ZnS nanostructures may produce comparable results. The catalyst related emission may be weak in these nanostructures. However, for 1.0 nm thick Mn catalyzed ZnS nanostructures, the blue and green emissions may drop significantly and Mn related defects (red emission) may emerge quite strongly (i.e., reaching 50%), which was around 20% in 0.2 nm and 0.5 nm Mn catalyzed nanostructures. The strong variation in the blue, green, and red emission may be attributed to the varied solubility of Mn in the growing ZnS nanostructures. It may also be observed that the extent of doping of Mn and its location in Mn catalyzed ZnS nanostructures may strongly depend on the size of Mn droplet. Its varied proportion on the surface directly affected the Zn and S vacancies that may be observed in the PL spectra.

There may be two possible scenarios of Mn dissolving in ZnS, based on its concentration, i.e., forming Mn clusters in the nanostructures or Mn residing on the tetrahedral cationic sites, that may be responsible for orange-red emission. Mn clusters may give rise to Mn—Mn interactions, which may inhibit the Mn related emission and enhance emission due to intrinsic Zn and/or S vacancies.

It is well known that the solubility of a small size catalyst may be high and the solubility may decrease with the increase in droplet size. With high Mn solubility, as in the case of 0.2 nm, Mn ions may form clusters due to strong dipolar interactions between Mn ions. When the size of the Mn droplet is increased, the Mn solubility may decrease and thus inhibit the formation of Mn clusters that may lead to uniform doping in the nanostructures. Mn in Mn doped ZnS nanostructures may occupy either a tetrahedral site by replacing Zn, or it may be in the form of exchange-coupled Mn clusters or in the form of a Mn—Mn pair. With low solubility (as in 1 nm Mn), the Mn concentration may decrease and thus prefer the tetrahedral cationic substitution, which may result in orange-red emission. With the increased Mn solubility, as in the case of 0.2 nm Mn, Mn clusters may be formed and result in luminescence quenching due to reduction in Mn d-d transitions, which may only appear when Mn—S bond exists. The peak related to S-state vacancy may shift from 442 nm to 432 nm for 0.2 nm to 1.0 nm, respectively, which may further prove that the tetrahedral cationic substitution took place for 1.0 nm Mn thick catalyzed ZnS nanostructures, which resulted in the shift of the peak to higher energy compared to 0.2 nm.

It is clear from the aforementioned that when Mn is doped in the form of clusters, the major contribution of luminescence may be due to intrinsic (S, Zn) related defects and when Mn may be uniformly doped as a tetrahedral cationic substitution, luminescence may appear due to Mn d-d states transitions that may result in decrease in magnitude of intrinsic defect related emissions and increase in orange-red emission.

Figure 5:
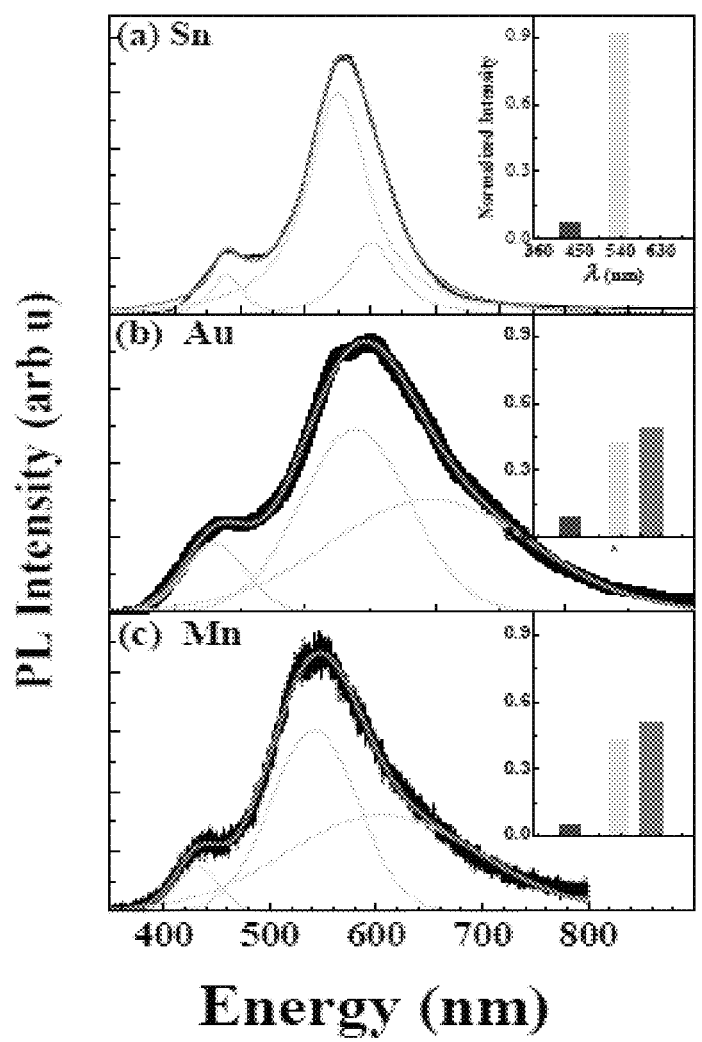
FIG. 5 illustrates room temperature PL spectra of ZnS nanostructures catalyzed with (a) Sn, (b) Au, and (c) Mn.

FIG. 5 show the room temperature PL spectra obtained from the 1 nm thick (a) Sn, (b) Au, and (c) Mn catalyzed ZnS nanostructures. Each spectrum fitted with three Gaussian functions is also shown. Insets of each PL spectra show the relative intensities of contributions from ZnS nanowires as determined from the PL spectra for three catalysts. As already noted, the PL spectra may show two distinct features, a sharp peak centered at around 440 nm due to S vacancies and a strong broad asymmetric peak centered at 540 nm due to Zn vacancies and catalyst defects related emission. All spectra were resolved by fitting three Gaussian functions centered at 440 nm, 540 nm, and 600 nm. However, the strong peak at 530 nm in the case of Sn catalyzed nanowires is a relatively sharp peak. The convoluted PL spectra shows that Sn did not produce defects by itself or if produced, those were non-radiative decay centers and were not observed in the PL spectrum. Another observation made from the PL spectra was that for Au, the low energy peak centered at 600 nm was broad and asymmetric. Furthermore, for Mn catalyzed nanowires, the peak may be less broad but was still asymmetric and in the case of Sn, no peak is observed at around 600 nm.

The contribution of each emission band to the total integrated intensity for each catalyst is shown in the inset of the PL spectra of each catalyst doped ZnS nanostructures. The PL spectra may reveal that the number of S vacancies may be small as compared to the number of Zn vacancies. All three catalysts may produce identical numbers of "S" vacancies, while the number of Zn vacancies may be large in comparison. However, Sn may be responsible for producing the largest number of Zn vacancies, which may be almost equal in magnitude for Au and Mn catalyzed ZnS nanostructures. It was also observed that the deep centers created by the Mn may be the highest, more than Au and may be absent in the case of Sn. The contribution of S vacancies was 8%, 5%, 7% in Au, Mn, and Sn catalyzed nanostructures, respectively. Thus Au and Sn may produce almost comparable numbers of S-state defects. On the other hand, the Zn vacancies were found to contribute appreciably, which may be almost comparable for Au and Mn at 42%, but may increase appreciably in the case of Sn catalyzed nanostructures to more than 90%. However, catalyst related deep impurities may be identical for both Au and Mn at 48% and 53%, respectively.

The dissimilar behaviors of catalysts may be attributed to their different miscibility behavior in the host lattice. For example, Sn as a catalyst may have one deep level eutectic in Sn—Zn phase diagram. Almost pure Zn may precipitate in the supersaturated Sn—Zn droplet. In the case of Au, existence of many intermetallic Au—Zn and Au—S phases may lead to the formation of Au—Zn and Au—S compounds in ZnS nanostructures. Similarly, formation of different Mn—S phases may lead to the formation of MnS compounds in ZnS nanostructures. The results of PL spectroscopy were consistent with the findings of XRD and XPS results, which show that Au and Mn form compounds with S, thus contributing in increasing the Zn vacancies. This may clearly demonstrate that the intrinsic defects, such as S or Zn vacancies states may be regulated by the type of catalyst and may occur as the catalyst was dissolved in the nanostructure.

Figure 6:
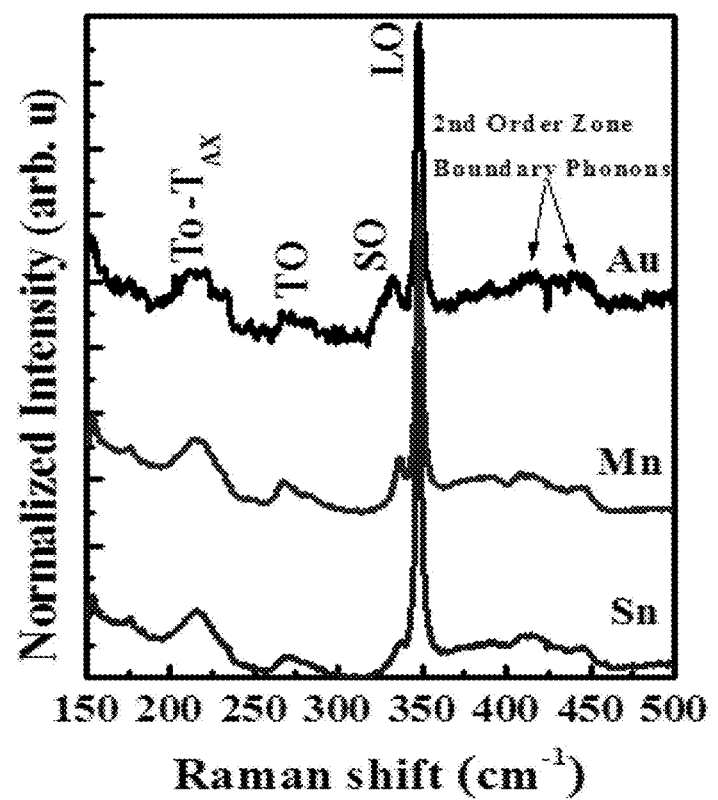
FIG. 6 illustrates Raman spectra of ZnS nanostructures catalyzed with (top) Au, (middle) Mn, and (bottom) Sn.

FIG. 6 illustrates Raman spectra obtained at room temperature from 1 nm thick Au, Mn, and Sn catalyzed ZnS nanostructures. Major Raman peaks are labeled in the top spectrum. All peaks as labeled in the top spectrum showed contribution of various expected Raman modes more or less at the same position as have already been reported. The major peaks were longitudinal optical (LO; at 347.7 cm$^{-1}$), a weak doublet peak due to $A_1/E_1$ (transverse optical: TO) modes at around 269 cm$^{-1}$ and $E_2$ (TO) at around 282 cm$^{-1}$ and an intermediate surface optic (SO) mode. The LO and TO modes for the bulk ZnS (Wurtzite-2H) may usually be observed at 350 cm$^{-1}$ and 276 cm$^{-1}$, respectively. The difference between the two TO peaks may vary with the choice of catalysts and were 13.79 cm$^{-1}$, 12.58 cm$^{-1}$, and 11.97 cm$^{-1}$, for Mn, Au, and Sn, respectively. ZnS in the Wurtzite crystal structure may exhibit polar behavior. In the high aspect ratio Wurtzite 1-D nanostructures, the long range dipolar interactions may give rise to an additional splitting of the TO mode. This may be because the dipole sums, which determine TO mode frequencies, are sensitive to the 1D nanostructures aspect ratio. Thus, the dependence of the splitting of TO modes on the type of catalysts may be due to miscibility of the catalyst in the host structure, which was highest for Mn, then Au, and followed by Sn.

It is noted that Mn has the highest solubility in ZnS and Sn has the lowest among the three catalysts used. This was further explored by analyzing the SO phonon modes. SO mode may appear only if there is a symmetry breaking at the surface of the nanostructure. It is also noted that the LO and TO modes remained independent of the choice of catalysts. However, SO phonon mode may be sensitive to the types of catalyst, and the separation between the LO and SO phonon modes may be different for different catalyzed ZnS nanostructures, as shown in FIG. 7A, where normalized Raman LO and SO phonon modes are plotted. In FIGS. 7A and 7B, the horizontal lines represent experimentally determined SO phonon energy for Mn, Au and Sn catalyzed nanowires. Arrows on the horizontal axis mark the estimated correlation lengths for three nanowires.

Referring to FIG. 7A, the $\Delta_{LO\text{-}SO}$ was 11.75 cm$^{-1}$, 12.35 cm$^{-1}$, and 16.51 cm$^{-1}$ in Mn, Sn, and Au catalyzed ZnS nanostructures, respectively. The small value in the case of Mn catalyzed ZnS nanostructures may show that Mn may be uniformly incorporated in the nanostructure during growth as compared to the Sn and Au. Mn doping may be favorable in the ZnS due to less bonding energy difference per bond and for the ZnS and Mn—S=0.99 eV while for the Au—S=2.21 eV and for the Sn—S=2.69 eV.

A detailed analysis of SO phonon mode also gave an insight into the doping or mixing of the catalysts in ZnS nanostructures. The SO phonon mode may usually be observed if there is symmetry breaking surface potential along the length of the wire. Surface symmetry breaking may arise either due to dopant on the surface or due to radial modulation during the growth. The radial modulation may happen if radius of the catalyst droplet is larger than the growing nanowire. However, in exemplary embodiments, the cross-sectional area of the ultimate grown nanowires may be larger than the catalyst droplets to introduce radial modulations. Thus it may be that surface symmetry breaking may occur due to catalyst doping at the surface. It has already been demonstrated that for a small catalyst droplet, the doping of the catalysts is expected to occur at the surface. The dielectric continuum model may be applied to determine the average wavelength of the surface potential modulations. The dispersion curves of the SO phonon modes may be determined from the symmetric (S) and asymmetric (AS) modes for a given momentum, q, as given in Equations 1 and 2, and plotted in FIG. 7B for Au, Mn, and Sn catalyzed ZnS nanostructures:

$$\omega_{SO}^2(q)_S = \omega_{TO}^2 \left[ \frac{\epsilon_o \tanh\left(\frac{q_i L_i}{2}\right) + \epsilon_m}{\epsilon_\infty \tanh\left(\frac{q_i L_i}{2}\right) + \epsilon_m} \right] \quad \text{Eq. (1)}$$

$$\omega_{SO}^2(q)_{AS} = \omega_{TO}^2 \left[ \frac{\epsilon_o \coth\left(\frac{q_i L_i}{2}\right) + \epsilon_m}{\epsilon_\infty \coth\left(\frac{q_i L_i}{2}\right) + \epsilon_m} \right] \quad \text{Eq. (2)}$$

It can be seen that a split in the SO phonon mode occurred into anti-symmetric (high energy) and symmetric modes (low energy). Also shown are the experimentally observed SO phonon energies, which are in the symmetric part of the dispersion, for each type of catalyst catalyzed ZnS nanowires. The dispersion of S and AS modes of SO phonon $\omega_{SO}(q)$ was calculated for ZnS nanostructures with a square cross section $L_x=L_y=L$, thus $q=\sqrt{2}q_i$ (where i=x, y) in air. The observed SO frequency in air $\omega_{SO}(q)$ was 331.12 cm$^{-1}$, 335.74 cm$^{-1}$, and 336.13 cm$^{-1}$ for Au, Sn, and Mn, respectively. The intersection of the experimentally observed value in FIG. 7 (dotted line) of the SO phonon mode with the symmetric (S) mode was found at qL=1.63, 3.6, and 3.7 for Au, Sn, and Mn, respectively. Assuming the square dimensions of the grown ZnS nanostructures catalyzed by Au (30×30 nm$^2$), Sn (50×50 nm$^2$), and Mn (26×26 nm$^2$) respectively, corresponding to the respective droplet dimensions, the wavelength for the surface symmetry breaking potential perturbations were determined and found as, $\lambda(=2\pi/q)$ 115 nm, 87 an, and 44 nm for Au, Sn and Mn, respectively. The surface symmetry breaking potential wavelength was high for Au, which may corresponded to large dimensions of the grown nanostructures and showed incorporation of Au in the agglomerated form in the bulk or away from the surface. While for Mn and Sn, the wavelength was small, which may explain the presence on the surface or very near the surface. These results are consistent with the findings of XRD and XPS.

Figure 8:
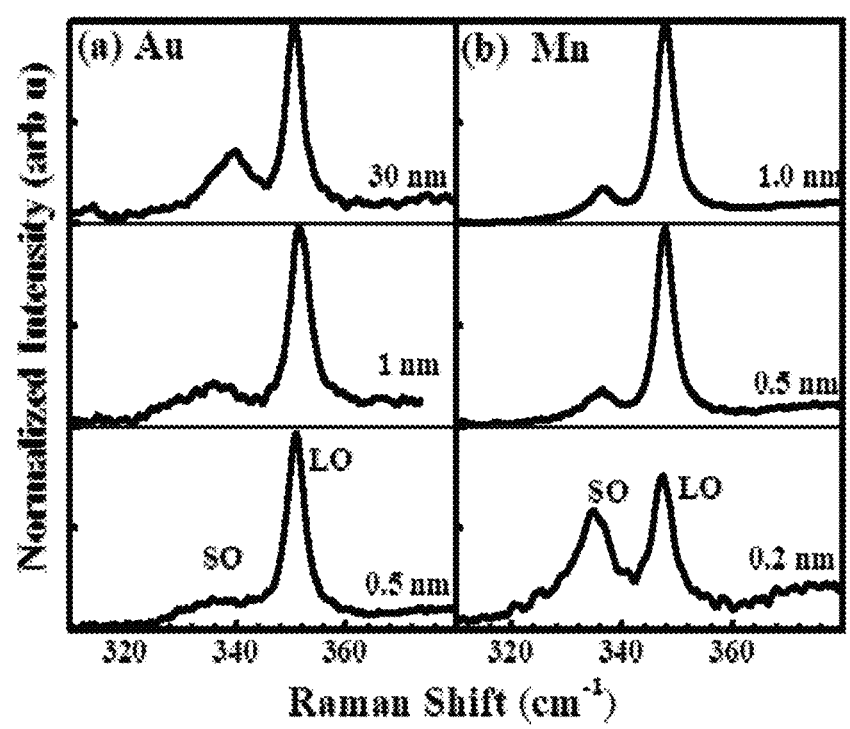
FIG. 8 illustrates Raman spectra of LO and SO modes from (a) Au and (b) Mn catalyzed ZnS nanowires grown with different thicknesses of catalysts as shown in each curve.

Another observation may be the effect of catalyst thickness on the LO and SO phonon modes. FIG. 8 shows the normalized Raman spectra of the LO and SO phonon modes of (a) Au and (b) Mn catalyzed ZnS nanostructures grown with three different thicknesses of Au (0.5 nm, 1.0 nm, and 30 nm) and Mn (0.2 nm, 0.5 nm, and 1.0 nm). It may be observed that the LO mode remained unchanged with varied thicknesses of catalysts. However, the SO phonon mode showed pronounced sensitivity to the size of catalysts. In addition, $I_{SO}/I_{LO}$ and energy difference between the LO and SO phonon modes may also vary with the catalyst thickness. The $\Delta_{(LO\text{-}SO)}$ was 17 cm$^{-1}$, 16.2 cm$^{-1}$, and 14.9 cm$^{-1}$, for 0.5 nm, 1.0 nm, and 30 nm of Au catalyzed nanowires. Similarly, the $\Delta_{(LO\text{-}SO)}$ was 12.58 cm$^{-1}$, 11.66 cm$^{-1}$, and 11.59 cm$^{-1}$ for 0.2 nm, 0.5 nm, and 1.0 nm thick Mn catalyzed ZnS nanowires, respectively. The variation in the relative intensities and energy difference may be due to the consequence of the solubility of the catalyst in the ZnS nanostructures.

Figure 9A:
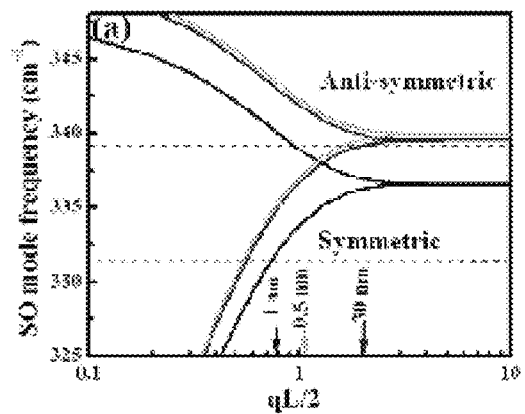
FIG. 9A, FIG. 9B, and FIG. 9C illustrate symmetric and anti-symmetric SO phonon dispersion curves for (a) Au and (b) Mn catalyzed ZnS nanostructures grown for different catalyst thicknesses, and (c) dispersion relation for cylindrical cross-section nanowires, respectively.
Figure 9B:
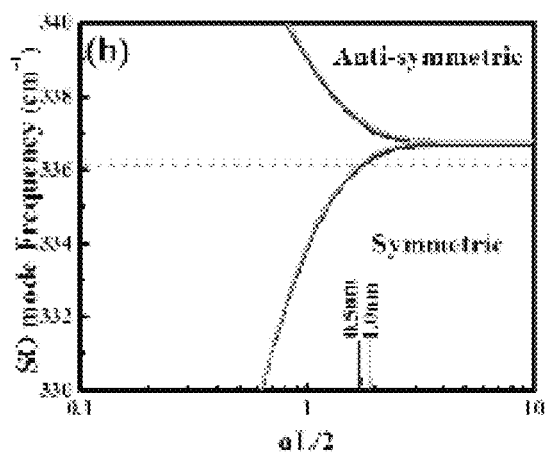

The correlation lengths for SO phonon modes may be determined from the calculated SO phonon dispersion curves for different thicknesses of Mn and Au catalyzed ZnS nanostructures and are plotted in FIGS. 9A and 9B. In FIGS. 9A and 9B, the horizontal lines represent the experimentally determined SO phonon energies and arrows on the horizontal axis represent the correlation length corresponding to SO phonon energies.

Referring to FIG. 9A, the experimentally observed SO phonon frequencies may be found to exist in the symmetric mode, and are shown by horizontal lines. The points of intersection with the symmetric (S) mode were at qL=2.09, 1.63, and 4.06 for 0.5 nm, 1.0 nm, and 30 nm thick Au catalyzed ZnS nanostructures, respectively, as shown in FIG. 9A. The wavelength of surface symmetry breaking may be found to be $\lambda(=2\pi q)$ 60 nm, 115 nm, and 141 nm for 0.5 nm, 1.0 nm, and 30 nm thick Au catalyzed ZnS nanostructures, respectively, by considering the initial square dimensions of the growing nanostructures as 20×20 nm$^2$, 30×30 nm$^2$, and 90×90 nm$^2$ for 0.5 nm, 1.0 nm, and 30 nm thick Au catalyst which corresponded to the catalyst droplet size. This clearly exemplifies that, for smaller Au droplet size, it was strongly present on the surface and as the Au size increased, and it became present in the bulk.

Figure 9C:
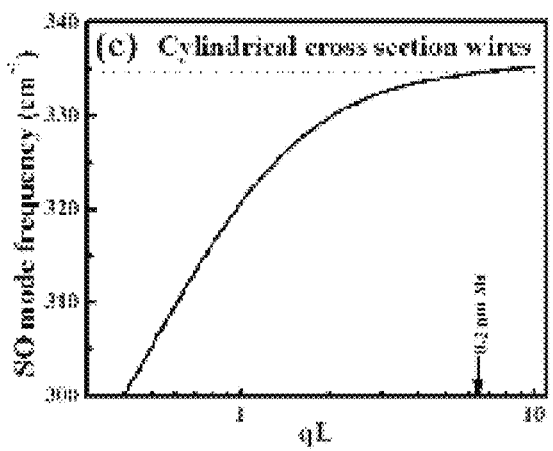

In the case of Mn catalyzed ZnS nanostructures with cylindrical cross section nanowires for 0.2 nm Mn thickness, the dispersion relation for SO phonon modes for the cylindrical cross section was used as shown in Equation 3;

$$\omega_{SO}^2(qr) = \omega_{TO}^2 + \frac{\epsilon_\infty(\omega_{LO}^2 - \omega_{TO}^2)}{\epsilon_\infty + \epsilon_m \frac{I_0(qr)K_1(qr)}{I_2(qr)K_0(qr)}} \quad \text{Eq. (3)}$$

where I and K denotes the Bessel functions and r denotes the radius of the nanowire. The dispersion relation for 0.2 nm Mn catalyzed nanostructures was calculated and is shown in FIG. 9C. The points of intersection were found at qL=6.48, 3.5, and 3.7 for 0.2 nm, 0.5 nm, and 1.0 nm thick Mn catalyzed ZnS nanostructures, respectively, as marked in FIGS. 9B and 9C. By considering the initial radius of the growing nanostructures as 9 nm for 0.2 nm Mn catalyst thickness and square dimensions of 14×14 nm$^2$ and 26×26 nm$^2$ for 0.5 nm and 1.0 nm Mn catalyst thicknesses that may corresponds to the catalyst droplet size. The calculated symmetry breaking surface potential modulation wavelength were found to be $\lambda(=2\pi/q)$ 9 nm, 25 nm, and 44 nm in 0.2 nm, 0.5 nm, and 1 nm thick Mn catalyzed ZnS nanowires, respectively. Small values of wavelength of symmetry breaking for small thicknesses of Au and Mn catalyzed nanostructures may also show that with the decrease in the catalyst size, surface of nanostructures became the favorable site for doping. Finally, it may be concluded that site and extent of doping may be strongly related to the size, as well as type of the catalyst that may result in the symmetry breaking at the surface. The exemplary embodiments show the results of structural analysis of effect of catalyst (Au, Mn) thickness on the extent and location of doping of the catalyst during the growth of nanostructures.

Although certain exemplary embodiments have been described herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

What is claimed is:

1. A method of synthesizing catalyst doped ZnS nanostructures, the method comprising:
    preparing a silicon substrate comprising an ultrathin silicon oxide layer;
    coating the silicon substrate with a catalyst by thermally evaporating a droplet including the catalyst, the catalyst comprising at least one of gold (Au), manganese (Mn), and tin (Sn);
    heating a zinc sulfide (ZnS) powder in a flowing carrier gas to form a ZnS vapor;
    exposing the catalyst coated silicon substrate to the ZnS vapor to grow a ZnS nanostructure comprising a nanowire and to dope the ZnS nanostructure with the catalyst; and
    modulating ZnS intrinsic defects by controlling the concentration of the catalyst and the size of the ZnS nanostructure,
    wherein:
    the concentration of the catalyst in the nanowire is dependent on the size of the catalyst.

2. The method of claim 1, wherein the optical properties of the ZnS nanostructure are tuned by complementing the concentration and the size of the catalyst.

3. The method of claim 1, wherein dopant atoms in the ZnS nanostructure form deep defects to cause the ZnS nanostructure to have a band gap emission in red region.

4. The method of claim 1, wherein the type of the catalyst and the concentration thereof modulate S vacancies and Zn vacancies in the ZnS nanostructure to cause variations in blue and green emissions.

5. The method of claim 1, wherein doping the ZnS nanostructure further comprises varying at least one of heat treatment temperature, a carrier gas of the ZnS powder, the size of the catalyst, and the concentration of the catalyst.

6. The method of claim 1, wherein the droplet has a radius of about 25 nm when the droplet comprises Mn.

7. The method of claim 6, wherein a thickness of the catalyst deposited on the silicon substrate is in a range of 0.2 to 1.0 nm.

8. The method of claim 1, wherein the droplet has a radius of about 31 nm when the droplet comprises Au.

9. The method of claim 8, wherein a thickness of the catalyst deposited on the silicon substrate is in a range of 0.5 to 30 nm.

10. The method of claim 1, wherein the droplet has a radius of about 50 nm when the droplet comprises Sn.

11. The method of claim 10, wherein a thickness of the catalyst deposited on the silicon substrate is 1.0 nm.

12. The method of claim 1, wherein the coated silicon substrate is heat treated to a temperature of 850° C. for the growth of the ZnS nanostructure.

13. The method of claim 12, wherein the growth of the ZnS nanostructure is performed for 2 hours.

14. The method of claim 1, wherein the ZnS powder is heated to a temperature of 1120° C.

* * * * *